United States Patent [19]

Ito et al.

[11] Patent Number: 4,900,696
[45] Date of Patent: Feb. 13, 1990

[54] METHOD FOR PATTERNING PHOTO RESIST FILM

[75] Inventors: Yasushi Ito, Kawasaki; Kazuhiko Urayama, Yokohama, both of Japan

[73] Assignee: Kabushiki Kaisha Toshiba, Kawasaki, Japan

[21] Appl. No.: 284,413

[22] Filed: Dec. 14, 1988

[30] Foreign Application Priority Data

Dec. 14, 1987 [JP] Japan .................................. 62-315813

[51] Int. Cl.[4] ..................... H01L 21/47; H01L 21/312
[52] U.S. Cl. ......................... 437/229; 148/DIG. 137; 156/659.1; 430/325; 437/949
[58] Field of Search ............... 148/DIG. 51, 104, 111, 148/137; 156/643, 662, 664, 659.1, 660; 430/327, 311, 313, 325, 326; 437/228, 229, 231, 949

[56] References Cited

U.S. PATENT DOCUMENTS

| Re. 29,015 | 10/1976 | De Angelo et al. | ................... 427/98 |
| 4,072,529 | 2/1978 | Hoornstra et al. | ................... 430/286 |
| 4,375,390 | 3/1983 | Anderson et al. | ............. 204/192.32 |
| 4,704,348 | 11/1987 | Koizumi et al. | ................... 430/327 |

Primary Examiner—Olik Chaudhuri
Assistant Examiner—William Bunch
Attorney, Agent, or Firm—Foley & Lardner, Schwartz, Jeffery, Schwaab, Mack, Blumenthal & Evans

[57] ABSTRACT

A method for patterning a photo resist film including the steps of coating a photo resist onto a semiconductor substrate exposing the photo resist coated and thereafter developing it, to thereby form a pattern on the photo resist film, wherein after exposure the semiconductor substrate on which the photo resist is coated is left in an atmosphere of a higher relative humidity than that at which the patterning exposure has been conducted for a time period until development.

5 Claims, 4 Drawing Sheets

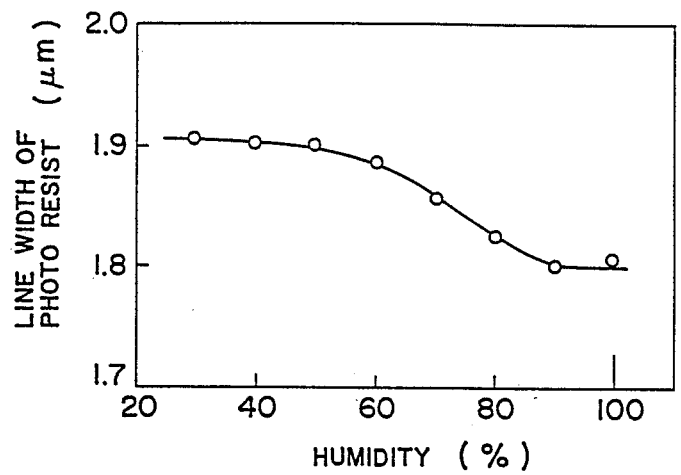
F I G. 5
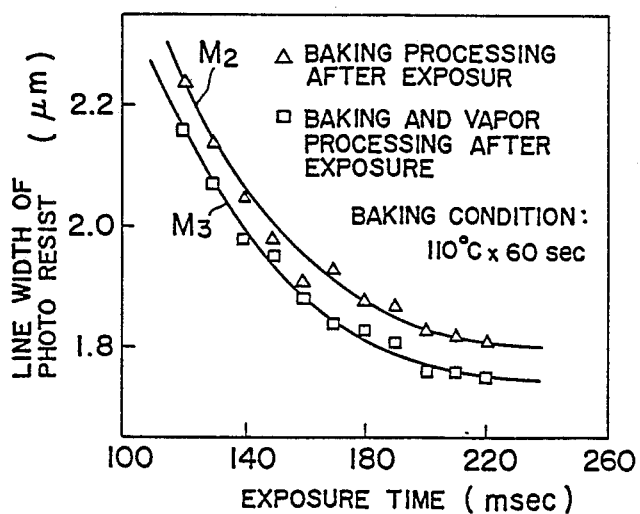
F I G. 7

METHOD FOR PATTERNING PHOTO RESIST FILM

BACKGROUND OF THE INVENTION

This invention relates to a method for patterning a photo resist film in which a photo resist is coated onto a semiconductor substrate to expose the photo resist coated thereafter to develop it, thereby to form a pattern on the photo resist film.

Heretofore, for forming a fine pattern on a semiconductor substrate, there has been conducted a procedure to coat a photo resist on the semiconductor substrate to apply baking thereto to carry out development after exposure or to conduct baking processing for a second time after exposure, thereafter to carry out development to form an etching mask, to therefore implement etching using the etching mask.

When such a conventional method is used, there arises the problem that solvent in a photo resist is volatilized according to the time that elapses since development processing after exposure, resulting in the variation of dissolving characteristic of the photo resist against developing solution and therefore in thickening line width of the photo resist.

In FIG. 1, change in the line width of the photo resist by the time elapsed since development processing after exposure is shown, wherein the abscissa shows the leaving time (elapsed time) and the ordinate shows line width of the photo resist. In this figure, circular marks indicate the points obtained by plotting the measured values of the line width of the photo resist when an experiment is conducted by changing the elapsed time and the graph K is an estimated curve showing the relationship between the elapsed time estimated from the measured result, and the line width of photo resist. From this graph K, it is seen that the line width of the photo resist becomes thick by about 0.95 ($\mu$m) by leaving the photo resist for about two hours. This causes no problem in the case of continuously conducting a sequence of processings from the coating of photo resist to the development to form a pattern of the photo resist. However, in the case where respective processings are not conducted continuously, the line widths of photo resists on different semiconductor devices may differ from each other. Moreover, if baking processing is implemented after exposure, thickening of the line width of the photo resist may be further accelerated according to the type of photo resists.

In FIG. 2, there are shown changes in the line width of the photo resist according to the exposure time in the case where development is implemented immediately after exposure, and in the case where baking processing is implemented after exposure to conduct development, wherein the exposure time (m sec) is taken on the abscissa and the line width ($\mu$m) of the photo resist is taken on the ordinate. The measured values of the line width of the photo resist when an experiment was conducted by changing the exposure time, are plotted with circular marks in the case of carrying out development immediately after exposure, and are plotted with triangular marks in the case of implementing baking processing for 60 seconds at a temperature of 110° C. after exposure. The respective estimation curves $M_1$ and $M_2$ showing the relationships between the exposure time and the line width of the photo resist in the case of development being carried out immediately after exposure and in the case of implementing baking processing after exposure are plotted with solid lines, respectively. From these estimation curves $M_1$ and $M_2$, lowering of the sensitivity corresponding to about 30 to 40 (m sec) occurs in the photo resist. This brings about a lowering in the throughput corresponding to about 40 seconds per lot (24 semiconductor substrates) processing.

The photo resist used here is a photo resist including e.g. quinone diazide as a photosensitizer. The chemical structure of typical material, 1-, 2-naphthoquinonediazidesulfonyl is shown below.

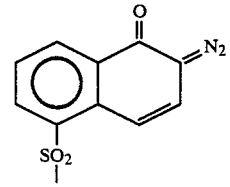

SUMMARY OF THE INVENTION

Accordingly, an object of this invention is to provide a method for patterning a photo resist film, which is capable of preferably improving the sensitivity of photo resist without lowering the sensitivity thereof.

According to this invention, there is provided a method for patterning a photoresist film comprising coating a photo resist onto a semiconductor substrate, exposing the photo resist coated and thereafter developing it, to thereby form a pattern of the photo resist film, wherein the semiconductor substrate on which the photo resist is coated, is left in the atmosphere of a higher relative humidity than that at which the patterning exposure has been conducted for a time period until the development after exposure.

In accordance with the method for patterning a photo resist film according to this invention thus constructed, as proven by experimental results, by leaving the semiconductor substrate on which the photo resist is coated in the atmosphere of higher relative humidity than that at which the patterning exposure has been conducted, it is possible to preferably improve the sensitivity of the photo resist without lowering the sensitivity thereof, and it is possible to reduce the line width changes by the leaving time until the development processing after exposure.

BRIEF DESCRIPTION OF THE DRAWINGS

In the accompanying drawings:

FIG. 5 is a graph showing the relationship between the humidity and line width of the photo resist when a semiconductor substrate on which the photo resist is coated, is left for 300 seconds in a vapor atmosphere after exposure;

FIG. 7 is a graph showing the relationships between the exposure time and the line width of the photo resist in the case of implementing baking processing for 60 seconds at a temperature of 110° C. after exposure and in the case of implementing the same processing as the above in an atmosphere with 100% humidity.

DESCRIPTION OF THE PREFERRED EMBODIMENT

Figure 3:
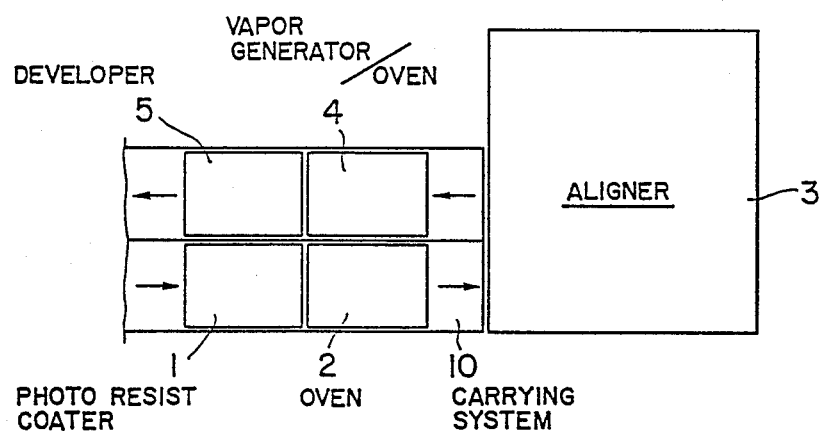
FIG. 3 is a block diagram showing an embodiment of an apparatus for implementing a method for patterning photo resist film according to this invention.

An embodiment of an apparatus for carrying out a method for patterning photo resist film according to this invention is shown in FIG. 3. This apparatus is provided with a photo resist coater 1, a baking oven 2, an exposure unit 3, a vapor generator/a baking oven 4, and a developer 5. A semiconductor substrate (not shown) carried by a carrying system 10 is conveyed to the photo resist coater 1, at which a photo resist is coated. The semiconductor substrate on which the photo resist is coated is then carried to the oven 2, at which the photo resist coated on the semiconductor substrate is dried. Then, this semiconductor substrate is conveyed to the exposure unit 3, at which the photo resist coated thereon is exposed. After exposure, it is carried to the vapor generator/oven 4, in which baking processing is conducted in an atmosphere with a higher relative humidity than that at which the patterning exposure has been conducted. Then, the semiconductor substrate is carried to the developer 5, at which the photo resist is developed.

Figure 4:
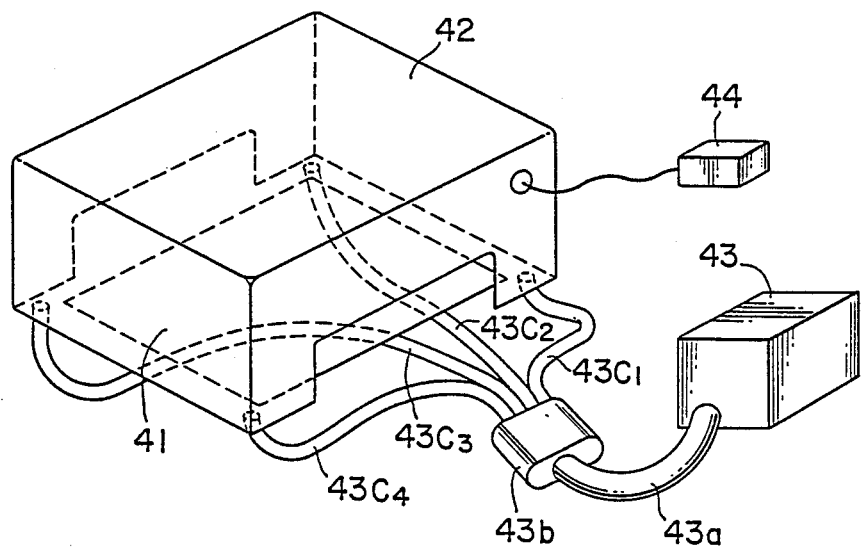
FIG. 4 is a perspective view showing the structure of a vapor generator and an oven shown in FIG. 3.

The structure of the vapor generator/oven 4 shown in FIG. 3 is illustrated in FIG. 4. This unit 4 is composed of a support 41 for mounting a semiconductor substrate thereon, a semi-hermetically sealed chamber 42 surrounding the support 41, and a vapor generator 43 for generating vapor to feed it into the chamber 42. The vapor generated by the vapor generator 43 is sent to a branching unit 43b through a pipe 43a and is then sent to the chamber 42 through pipes 43C$_1$, 43C$_2$, 43C$_3$ and 43C$_4$ connected at their bottoms to the chamber 42. Moreover, a hygrometer 44 for detecting relative humidity within the chamber 42 is provided on the side surface of the chamber 42. An output signal from the hygrometer 44 is sent to a control unit (not shown). Thus, the operation of the vapor generator is controlled by the control unit. A hot plate may be used as the support 41 for mounting the semiconductor substrate.

In FIG. 5, there is shown a graph of the change in the line width of the photo resist in the case of changing the relative humidity within the chamber 42 shown in FIG. 4 so that it indicates 30, 40, 50, 60, 70, 80, 90 and 100% within the chamber, at which the semiconductor substrate on which the photo resist is coated, is left for 300 seconds after exposure. From this graph, it is seen that the sensitivity of the photo resist is improved and the line width is stabilized in the case of leaving the semiconductor substrate at a humidity of about 60% or more.

Figure 6:
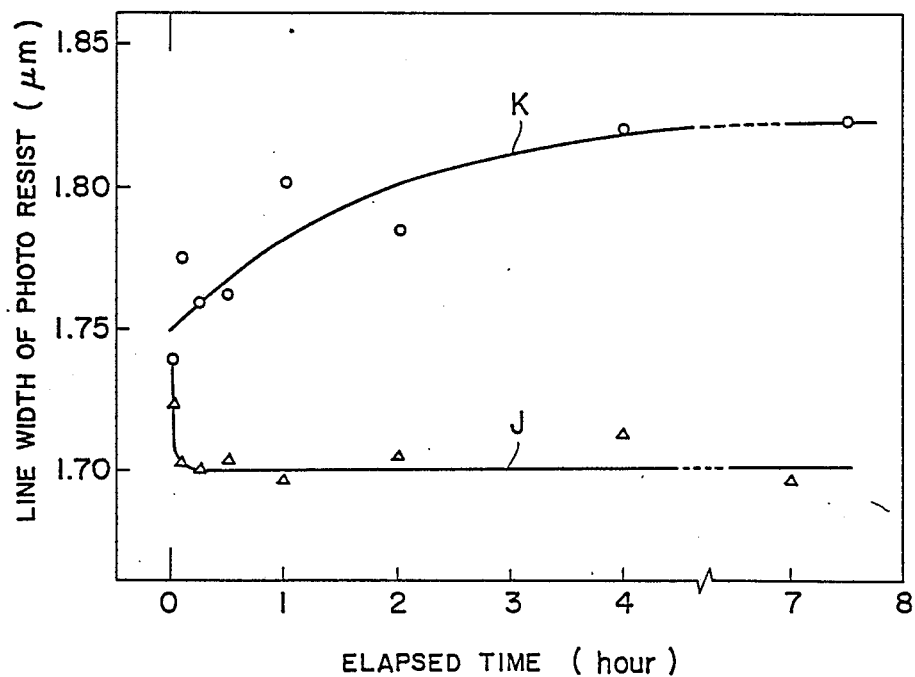
FIG. 6 is a graph showing the change in the line width of the photo resist by the time elapsed until the development processing after exposure, and a change in the line width of the photo resist by the elapsed time in the atmosphere of humidity of 100% in the case of leaving the photo resist in that atmosphere after exposure, and conducting development processing thereafter.

FIG. 6 is a graphical representation showing the relationship between the time left in a chamber in which the humidity is in a supersaturated state, and the line width in the photo resist in the case of using the apparatus shown in FIG. 4 to leave within that chamber the semiconductor substrate having undergone exposure to conduct development wherein the graph J shows its estimation curve.

Figure 1:
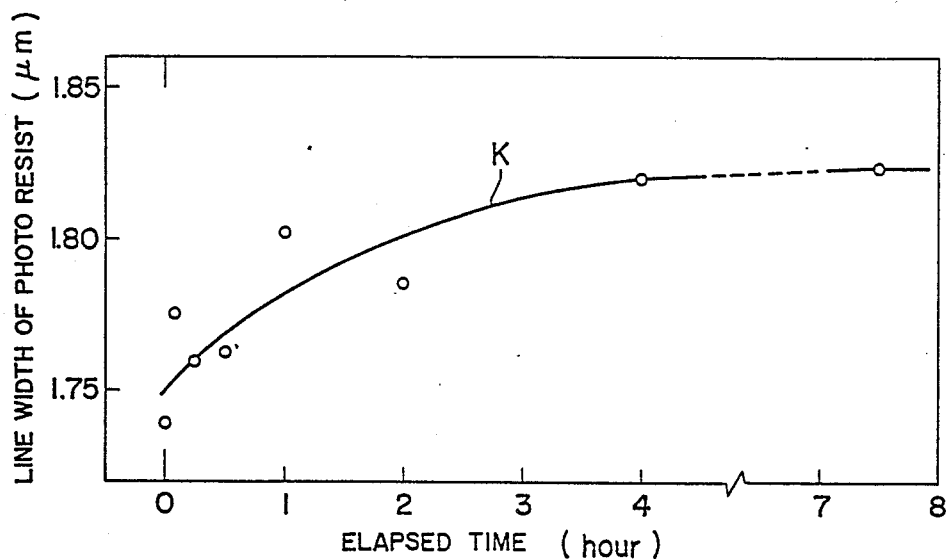
FIG. 1 is a graph showing the change in the line width of the photo resist by the exposure time until the development processing.

In this graph, the estimation curve K of the change in the line width of the photo resist until the development processing after exposure shown in FIG. 1 is plotted together. From these estimation curves, it is seen that when the semiconductor substrate having undergone exposure, is left within the chamber in which the humidity is in a supersaturated state, the change of the line width becomes extremely decreased when compared to the case where that semiconductor substrate is left at a clean room humidity.

It is to be noted that if the elapsed (leaving) time from exposure to vapor processing and from the vapor processing to development processing is made as short as possible in this case, the change of the line width may be accordingly reduced even more.

Figure 2:
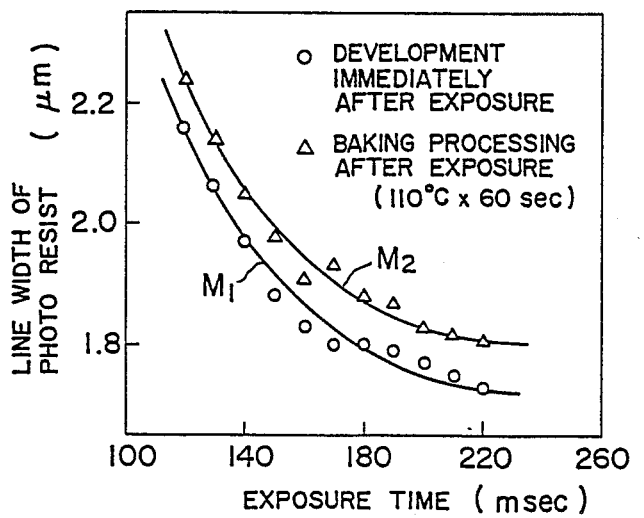
FIG. 2 is a graph showing the relationships between the exposure time and the line width of the photo resist in the case of carrying out development immediately after exposure, and in the case of implementing baking processing for 60 seconds at a temperature of 110° C. after exposure to conduct development.

In FIG. 7, there is shown a graph of changes in the line width of the photo resist by the leaving time in the case of using the apparatus shown in FIG. 4 to leave a semiconductor substrate having undergone exposure within chamber 42 in which the humidity is in a supersaturated state (approximately 100%) to carry out the baking processing for 60 seconds at a temperature of 110° C., wherein the exposure time (m sec) is taken on the abscissa and the line width ($\mu$m) of the photo resist is taken on the ordinate. In this graph, the measured values of the line width of the photo resist when an experiment is conducted by changing the exposure time are plotted with square marks, and the estimation curve M$_3$ showing the relationship between the exposure time and the line width of the photo resist, which is estimated on the basis of these measured values, is plotted with solid lines. In FIG. 7, the estimation curve M$_2$ in the case of implementing baking processing at an ordinary humidity (about 30%) of the clean room after exposure, which is shown in FIG. 2, is also plotted along with measured results (indicated by triangular mark). From these estimation curves M$_2$ and M$_3$, it is seen that the baking processing in an atmosphere with a humidity of 100% allows the sensitivity of the photo resist to be improved more than baking processing in the atmosphere of clean room humidity (about 30%), by about 20%.

As described above, this embodiment can improve the sensitivity of the photo resist and reduce the change of the line width by the time that elapses until the development processing after exposure.

What is claimed is:

1. A method for patterning a photo resist film comprising the steps of coating a photo resist onto a semiconductor substrate, exposing the photo resist coated and thereafter developing it, thereby to form a pattern of the photo resist film,
   wherein said semiconductor substrate on which said photo resist is coated, and exposed is left in an atmosphere of a higher relative humidity than that at which the patterning exposure has been conducted for a time period before development.

2. A method for patterning a photo resist film as set forth in claim 1, wherein after exposure, baking processing is implemented to said semiconductor substrate in an atmosphere having a higher relative humidity than that at which the patterning exposure has been conducted.

3. A method for patterning a photo resist film as set forth in claim 1, wherein after exposure, said semiconductor substrate is left in an atmosphere of a higher relative humidity than that at which the patterning exposure has been conducted, thereafter to carry out baking processing.

4. A method for patterning a photo resist film as set forth in claim 1, wherein baking processing is carried out after exposure, thereafter leaving said semiconductor substrate in an atmosphere of a higher relative humidity than that at which the patterning exposure has been conducted.

5. A method for patterning a photo resist film as set forth in claim 1, wherein the leaving in an atmosphere of high humidity is conducted within a chamber provided with heating means.

* * * * *